United States Patent [19]

Schutz et al.

[11] Patent Number: 5,440,520
[45] Date of Patent: Aug. 8, 1995

[54] INTEGRATED CIRCUIT DEVICE THAT SELECTS ITS OWN SUPPLY VOLTAGE BY CONTROLLING A POWER SUPPLY

[75] Inventors: Joseph D. Schutz, Portland, Oreg.; Bill C. Rash, Saratoga, Calif.

[73] Assignee: Intel Corporation, Santa Clara, Calif.

[21] Appl. No.: 307,190

[22] Filed: Sep. 16, 1994

[51] Int. Cl.6 .............................................. G11C 7/04
[52] U.S. Cl. .................................. 365/226; 365/211; 365/212; 327/512; 327/513; 257/467; 323/907; 361/103
[58] Field of Search ....................... 365/226, 211, 212; 257/467; 327/512, 513; 323/907; 361/103

[56]  References Cited

U.S. PATENT DOCUMENTS

| | | | |
|---|---|---|---|
| 3,750,119 | 7/1973 | Frankenberg | 365/130 |
| 3,835,458 | 9/1974 | Mrazek | 365/211 |
| 4,094,007 | 6/1978 | Minami | 365/211 |
| 4,849,933 | 7/1989 | Allen | 365/211 |
| 4,924,111 | 5/1990 | Anderson et al. | 257/467 |
| 5,073,838 | 12/1991 | Ames | 327/512 |
| 5,197,033 | 3/1993 | Watanabe et al. | 365/226 |
| 5,285,418 | 2/1994 | Yamaguchi | 365/211 |
| 5,376,819 | 12/1994 | Gay et al. | 257/467 |
| 5,379,230 | 1/1995 | Morikawa et al. | 327/512 |

OTHER PUBLICATIONS

"The Metaflow Architecture", pp. 10–13 and 63–73, by Val Popescu, Merle Schultz, John Spracklen, Gary Gibson, Bruce Lightner, and David Isaman, IEEE Micro, 1991.

Primary Examiner—David C. Nelms
Assistant Examiner—Tan Nguyen
Attorney, Agent, or Firm—Blakely, Sokoloff, Taylor & Zafman

[57]  ABSTRACT

The specification describes an integrated circuit device that selects its own supply voltage by controlling a programmable power supply. The programmable power supply provides a supply voltage in response to one or more voltage control signals generated by the integrated circuit device. The integrated circuit device includes a voltage control circuit for generating the voltage control signals according to one or more predetermined operational voltages programmed into the integrated circuit device such that the supply voltage is substantially equal to a selected one of the predetermined operational voltages. The integrated circuit device may include a temperature sensor to allow selection of the predetermined operational voltage according to device temperature to avoid speed-limiting voltage and temperature combinations.

7 Claims, 4 Drawing Sheets

INTEGRATED CIRCUIT DEVICE THAT SELECTS ITS OWN SUPPLY VOLTAGE BY CONTROLLING A POWER SUPPLY

FIELD OF THE INVENTION

The present invention relates generally to supplying electrical power to circuits, and more specifically to integrated circuit devices that select their own supply voltage by controlling a separate power supply.

BACKGROUND OF THE INVENTION

The present invention addresses two problems associated with the operational voltage (i.e., the power supply voltage) of today's microprocessors and other integrated circuit devices (ICs). First, the operational voltages of today's microprocessors are progressively being decreased in order to optimize performance and reduce power consumption. Reducing the operational voltage permits down-scaling of a microprocessor's transistors which helps to provide higher frequency operation. This "decreasing operational voltages" problem mainly affects board designers and computer manufacturers because each decrease requires costly changes to existing computer system designs in order to provide the new operational voltages. Second, having to guarantee microprocessor operation over a full range of voltage and temperature specifications limits the upper frequency specification of IC devices. This "full voltage range specification" problem mainly affects microprocessor manufacturers by limiting the high-end speed performance of their microprocessors. These problems, however, are not unique to microprocessors but are associated to some degree with all integrated circuit devices. Each problem will now be discussed in more detail.

Decreasing Operational Voltages Problem. Computers and other digital devices include a variety of individual ICs. For example, a personal computer, such as an IBM PC TM computer, or compatible type computer, typically includes a microprocessor, memory chips, various peripheral controller chips, video display chips, etc. Each IC requires electrical power. A PC also includes a power supply for supplying various supply voltages to the ICs. A typical PC power supply provides voltages of ±5.0 and ±12.0 volts. Traditionally, a PC's microprocessor has operated at the ±5.0 volt supply voltage.

Today the operational voltage of microprocessors are progressively being reduced in order to help increase microprocessor performance and reduce power consumption to increase battery life of laptop and notebook computers. Reducing the operational voltage helps to provide increased performance because at the reduced voltage the microprocessor's transistors can be scaled to smaller sizes which are capable of operating at higher frequencies. For example, a 3.3 volt version of the i486 TM microprocessor available from Intel Corporation of Santa Clara, California is currently available and future versions operating at 2.5 volts and 1.8 volts are already planned. Previously, Intel architecture microprocessors were only available in 5.0 volt versions.

But along with the benefits of reduced power consumption, decreasing the operational voltage of today's microprocessors poses problems for both computer system manufacturers and microprocessor manufacturers. For computer manufacturers, one problem is having to redesign their computer systems with a new power supply to provide the new supply voltage. For microprocessor manufacturers, one problem is having to provide multiple versions of their microprocessors, one that operates at the reduced voltage and another that operates at the old voltage, because not all computer manufacturers are able to change to the reduced voltage microprocessors.

Full Voltage Range Specification Problem. The highest frequency, or highest speed, of reliable operation speed of an integrated circuit device changes with the supply voltage and the temperature of the device. For example, at a constant temperature a microprocessor's maximum frequency typically increases with increasing supply voltage (within the operational range). At a constant supply voltage a microprocessor's maximum frequency typically decreases with increasing temperature. Therefore, a typical microprocessor is slowest when operating at low voltage and high temperature and fastest when operating at high voltage and low temperature.

Today, microprocessor manufacturers specify a guaranteed range of supply voltages and temperatures over which their microprocessors are guaranteed to operate at a specified upper frequency. For example, one version of Intel's i486 TM microprocessor is specified to operate at 66 MHz over a temperature range of 0°–85° C. and a power supply voltage range of 5.0±0.25 volts. Another version of Intel's i486 TM microprocessor is specified to operate at 66 MHz over a temperature range of 0°–85° C. and a power supply voltage range of 3.3±0.3 volts.

Having to guarantee microprocessor operation over a full range of supply voltages and temperatures unduly limits the upper frequency specification because only certain supply voltage and temperature combinations exhibit slower performance. If the frequency-limiting supply voltage and temperature combinations (such as low voltage and high temperature) could be avoided, the upper frequency specification of the microprocessor could be increased, thereby providing higher performance microprocessors.

Considering the foregoing problems, an integrated circuit device that selects its own supply voltage by controlling a power supply is needed.

SUMMARY OF THE INVENTION

The present invention covers an integrated circuit device that selects its own supply voltage by controlling a programmable power supply.

In one embodiment, the present invention includes an integrated circuit device that is used with a programmable power supply. The programmable power supply provides a supply voltage to the integrated circuit device according to one or more voltage control signals generated by the integrated circuit device. The integrated circuit device includes a voltage control circuit for generating the voltage control signals according to a predetermined operational voltage of the integrated circuit device such that the supply voltage is substantially equal to the predetermined operational voltage of the integrated circuit. The integrated circuit device may include an encoding apparatus for programmably selecting the predetermined operational voltage.

In another embodiment, the present invention integrated circuit device includes an apparatus that generates the voltage control signals according to one or more predetermined operational voltages of the integrated circuit device and the temperature of the device.

BRIEF DESCRIPTION OF THE DRAWINGS

The present invention is illustrated by way of example and not limitation in the figures of the accompanying drawings in which like references indicate similar elements.

DETAILED DESCRIPTION OF THE PRESENT INVENTION

An integrated circuit device that selects its own supply voltage by controlling a power supply is described. In the following description, numerous specific details such as integrated circuit types, power supply types, and frequency, temperature, and voltage ranges, are set forth in order to provide a thorough understanding of the present invention. It will be apparent, however, to one skilled in the art that the present invention may be practiced without these specific details. In other instances, well-known methods and circuits are shown in block diagram form in order not to obscure the present invention. It is understood that the present invention may be comprised of transistor circuits that are readily manufacturable using well-known CMOS (complementary metal-oxide semiconductor) technology, Bi-CMOS (BipolarCMOS), or other semiconductor manufacturing processes. Implementation of the present invention in various types of integrated circuit devices, including memories, processors, logic, etc., is within the scope and spirit of the present invention.

Figure 1:
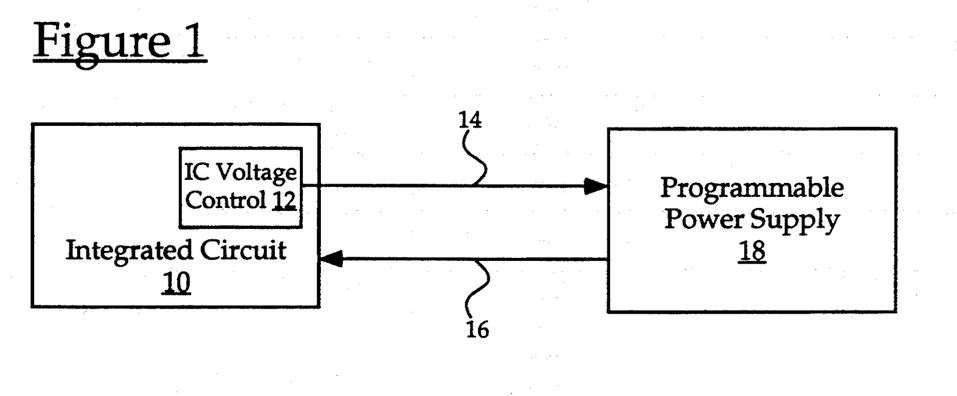
FIG. 1 is a block diagram of an integrated circuit device that controls a programmable power supply to select its own supply voltage.

Referring to FIG. 1, a block diagram of an integrated circuit device that controls a programmable power supply to self-select a supply voltage of the integrated circuit device is shown. An integrated circuit device 10 generates one or more voltage control signals 14 to select or control a supply voltage 16 provided by a programmable power supply 18 to integrated circuit device 10. Integrated circuit device 10 controls the programmable power supply 18 such that the supply voltage 16 is substantially equal to a predetermined operational voltage of integrated circuit device 10. In other words, integrated circuit device 10 selects its own supply voltage by controlling the programmable power supply 18. Integrated circuit device 10 may control the supply voltage 16 in either an open-loop or closed-loop manner. In one embodiment, integrated circuit device 10 selects the supply voltage 16 according to a predetermined operational voltage of the device 10. In another embodiment, integrated circuit device 10 selects the supply voltage 16 based on a plurality of predetermined operational voltages and the temperature of integrated circuit device 10. In one embodiment, the predetermined operational voltage(s) of the device 10 are programmed into circuit device 10. The voltage control signals 14 may be analog, digital, or a combination of analog and digital signals.

The programmable power supply 18 generates the supply voltage 16 according to (or in response to) the voltage control signals 14. The programmable power supply 18 may respond to either analog, digital, or a combination of analog and digital control signals. Programmable power supplies are well-known in the art. Some suitable programmable power supplies are described in U.S. Pat. No. 5,103,110 entitled *Programmable Power Supply*, U.S. Pat. No. 4,893,228 entitled *High-Efficiency Programmable Power Supply*, U.S. Pat. No. 4,679,130 entitled *Programmable Power Supply*, and U.S. Pat. No. 4,335,445 entitled *System for Interfacing Computers with Programmable Power Supplies.*

Integrated circuit device 10 may be any type of integrated circuit device. An "Integrated Circuit Device" is defined as an interconnection of circuit elements inseparably associated on or within a continuous supporting material known as a substrate. In a monolithic integrated circuit device, the substrate is a thin block of semiconductor material, usually silicon, in which circuit elements are formed by the diffusion of specific impurities to yield the appropriate electrical characteristics. In specific embodiments, integrated circuit device 10 may include circuitry to implement such functions as a processor, a memory, a state machine, digital logic, and analog circuits.

Each particular integrated circuit device 10 is designed to operate at one or more supply voltages, i.e. predetermined operational voltage(s) of integrated circuit device 10, with some tolerance allowed. For example, integrated circuit device 10 may be designed to operate at a supply voltage of 5.0±0.25 volts. Integrated circuit device 10 may also be designed to operate at lower supply voltages, such as 3.3 V, 2.5 V, 1.8 V, 1.5 V, and 1.2 V, in order to help reduce power consumption and optimize the performance of integrated circuit device 10. The highest frequency, or highest speed, of reliable operation of integrated circuit device 10 varies with the supply voltage and the temperature of integrated circuit device 10.

Integrated circuit device 10 includes an IC voltage control circuit 12 for generating the voltage control signal(s) 14. In one embodiment, the IC voltage control circuit 12 generates the voltage control signals 14 according to a predetermined operational voltage value that is encoded or programmed into integrated circuit device 10. For example, in the embodiment of FIG. 1A, the IC voltage control circuit 12 includes a non-volatile memory 20 that may be programmed with a value corresponding to a predetermined operational voltage of integrated circuit device 10. The non-volatile memory 20 may comprise ROM, EPROM, EEPROM, FLASH, or other types of non-volatile memory. For example, a three bit non-volatile memory could be used to program up to eight different predetermined operational voltage values such as those shown below in Table 2.

TABLE 2

Figure 1A:
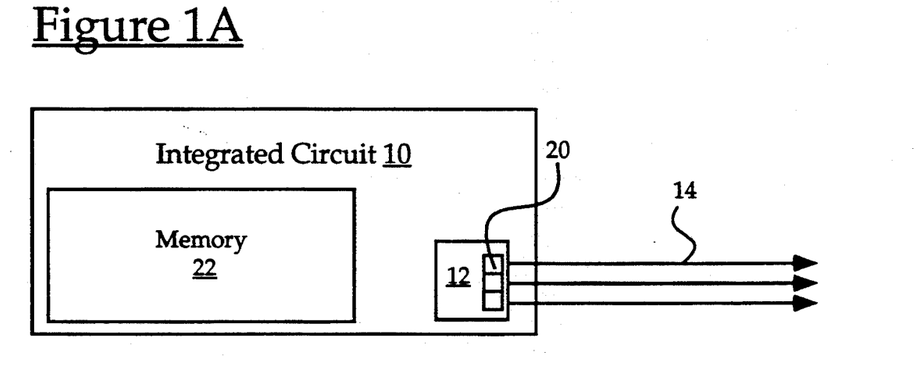
FIG. 1A is a block diagram of an integrated circuit device having a nonvolatile memory for programming a predetermined operational voltage of the integrated circuit device.

| predetermined operational voltage | programmed value |
|---|---|
| +5.0 | 000 |
| −5.0 | 001 |
| 12.0 | 010 |
| 3.3 | 011 |
| 2.5 | 100 |
| 1.8 | 101 |
| 1.5 | 110 |
| 1.2 | 111 |

The predetermined operational voltage of a particular device may be selected based on the particular manufacturing process used, the intended use of the device, the performance characteristics of the device, or other considerations. The predetermined operational voltage may be programmed or encoded into the device either during manufacturing or after final testing of the device. For example, a ROM programming apparatus would be programmed during manufacturing, an EPROM or EEPROM programming apparatus could be programmed after final production testing of the device, and a bond-out programming apparatus would be programmed after final test during the packaging of the device.

Figure 1B:
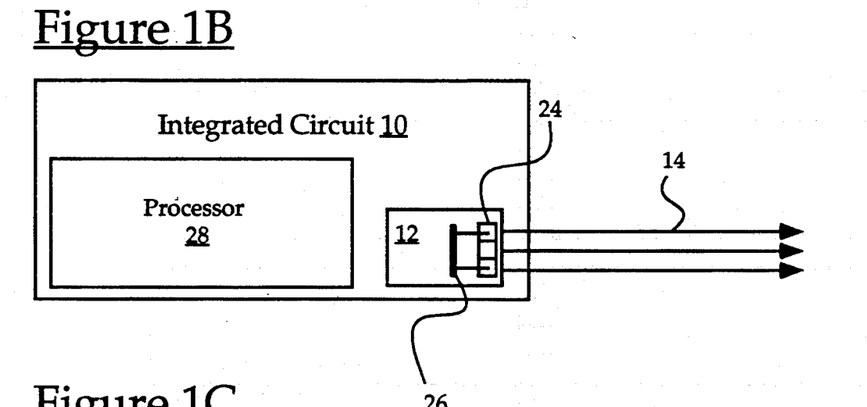
FIG. 1B is a block diagram of an integrated circuit device having programmable bond pads for programming a predetermined operational voltage of the integrated circuit device.

In the embodiment of FIG. 1B, the IC voltage control circuit 12 includes bond pads 24 that can be programmed to either ground 26 or left floating to select the predetermined operational voltage. In other embodiments, other types of circuits may be used to program one or more predetermined operational voltage(s) of integrated circuit device 10.

In one embodiment, the voltage control signals 14 are digital signals. In an open-loop design, the programmable power supply 18 supplies a corresponding supply voltage value for each value presented by the digital voltage control signals. For example, when operated with the values of Table 2 above the power supply 18 is programmed to generate a supply voltage 16 of +5.0, −5.0, 12.0, 3.3, 2.5, 1.8, 1.5, and 1.2 volts in response to digital combinations of 000 through 111, respectively, of the voltage control signals 14. In a closed-loop design, one or more digital signals are used to incrementally increase or decrease the supply voltage such that the supply voltage is substantially equal to the predetermined operational voltage. For example, in one embodiment increase and decrease signals are generated to cause the power supply to incrementally increase or decrease, respectively, the supply voltage. Alternatively, a single digital signal may be used to cause the supply voltage to increase when in one state and decrease when in another state.

Figure 1C:
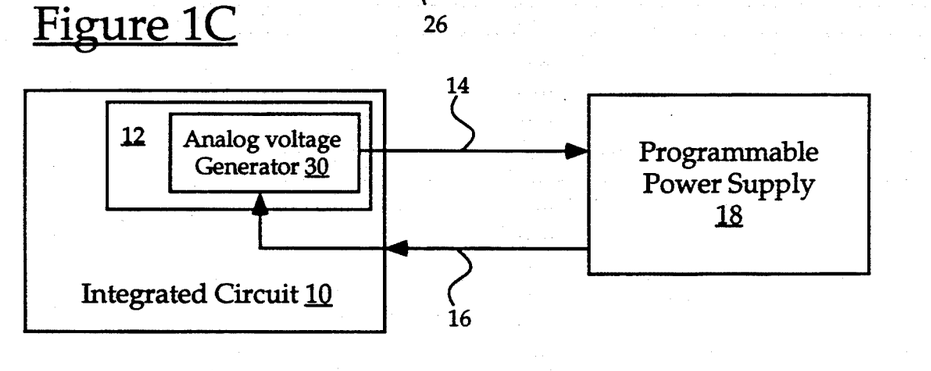
FIG. 1C is a block diagram of an integrated circuit device that generates an analog voltage control signal for controlling its own supply voltage.

FIG. 1C illustrates an embodiment of integrated circuit device 10 where the voltage control signal 14 is an analog signal that may be generated in either an open-loop or closed-loop manner. IC voltage control circuit 12 includes an analog voltage generator 30 for generating the analog control signal 14 according to the predetermined operational voltage of device 10. Circuits for generating analog voltages are well-known in the art. For example, digital-to-analog converters and band-gap circuits are commonly used to provide selectable analog voltages. U.S. Pat. No. 5,166,562 entitled *Writable Analog Reference Voltage Storage Device* describes a circuit for generating N analog voltages by controlling the charge on N floating gate devices which are coupled to follower amplifier circuits. In one embodiment, the analog control signal 14 is generated a fixed amount of voltage lower than the predetermined operational voltage of integrated circuit device 10. In this embodiment, the programmable power supply 18 provides the supply voltage 16 substantially the fixed amount larger than the control voltage 14 such that the supply voltage 16 is substantially equal to the predetermined operational voltage. The fixed amount of voltage may be set to a minimum operational voltage of the IC voltage control circuitry 12 such that upon power-up the programmable power supply 18 immediately supplies enough voltage to allow the IC voltage control circuit 12 to begin operationally (or reliably) controlling the supply voltage 16. In another embodiment, the analog control voltage 14 is substantially equal to the predetermined operational voltage and the power supply 18 supplies a supply voltage 16 substantially equal to the control voltage 14.

Figure 1D:
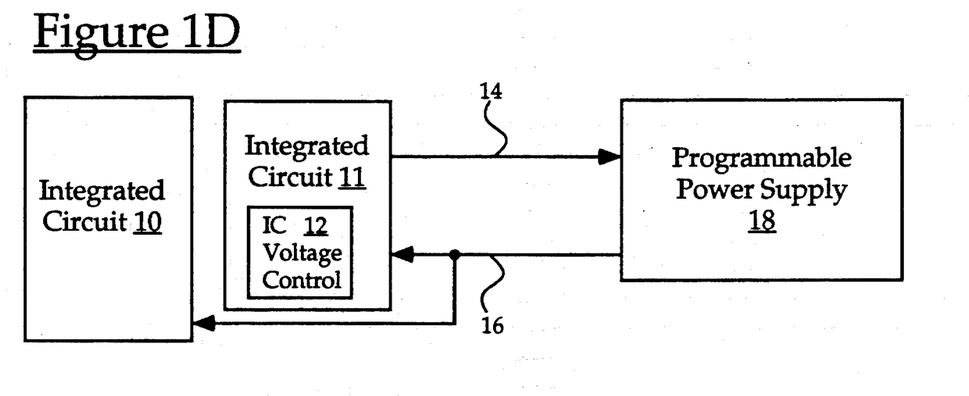
FIG. 1D is a block diagram of a second integrated circuit device that controls a power supply to select the supply voltage of a first integrated circuit.

FIG. 1D is a block diagram of an embodiment where the IC voltage control circuit 12 is part of a separate integrated circuit 11. In some cases, the process for manufacturing device 10 may not be optimal for manufacturing the IC voltage control circuit 12, such as where the integrated circuit device 10 is a digital device but the voltage control signals are analog. In this case, the IC voltage control circuit 12 may be manufactured on a separate integrated circuit 11 using a suitable semiconductor manufacturing process.

Figure 2:
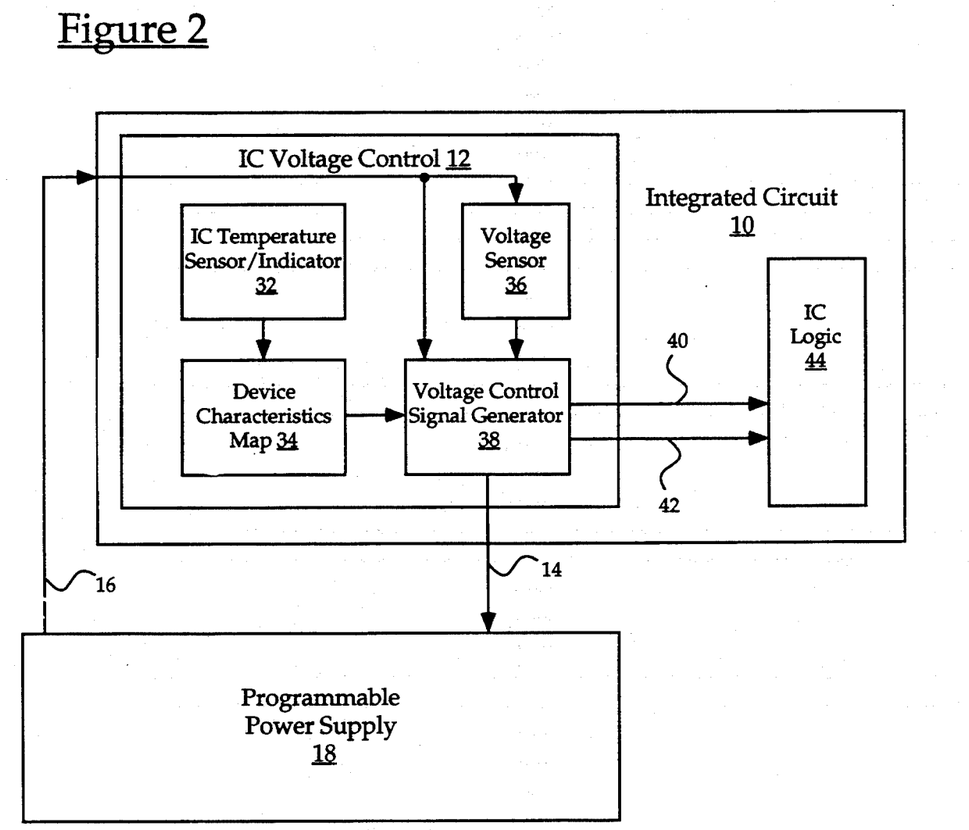
FIG. 2 is a block diagram of an integrated circuit device that selects its own supply voltage according to the characteristics and temperature of the integrated circuit device.

FIG. 2 is a block diagram of an embodiment where integrated circuit device 10 selects the supply voltage 16 based on a plurality of predetermined operational voltages and the temperature of integrated circuit device 10. This embodiment helps to increase integrated circuit performance by avoiding speed-limiting voltage/temperature combinations. In this embodiment, the IC voltage control circuit 12 includes an IC temperature sensor circuit 32, a device characteristics map 34, a voltage sensor circuit 36, and a voltage control signal generator 38. The IC voltage control circuit 12 generates the voltage control signals 14 and, in addition, a slow IC signal 40 and a stop IC signal 42 to slow or stop operation, respectively, of IC logic 44 when the temperature or voltage of device 10 is in or near an inoperable or destructive range. For example, the slow and stop IC signals can be asserted to prevent device damage when the temperature or supply voltage of device 10 are too high.

The IC temperature sensor 32 senses the temperature of the device 10 and indicates that temperature to the device characteristics map 34. The IC temperature sensor 32 may comprise well-known circuits for indicating temperature, such as a temperature sensing diode circuit. One such circuit for measuring the temperature of an integrated circuit device is described in U.S. Pat. No. 4,924,112 entitled *Microprocessor Having High Current Drive and Feedback for Temperature Control*. The IC temperature sensor 32 generates either a current or voltage that is proportional to the temperature of integrated circuit device 10 which is then converted to a digital value for indexing or addressing the device characteristics map 34.

The device characteristics map 34 stores predetermined operational characteristics of integrated circuit device 10. The device characteristics map 34 may comprise a non-volatile memory or other suitable means for storing the characteristics of integrated circuit device 10. In one embodiment, the device characteristics map 34 stores a plurality of predetermined operational voltage values that respectively correspond to a plurality of temperature ranges at which integrated circuit device 10 may be operated. The predetermined operational voltages may be chosen to optimize the high speed or high frequency performance of integrated circuit device 10 at a given temperature. For example, in a particular integrated circuit device 10 whose standard operational voltage is 3.3 volts, the device characteristics map 34 may store the predetermined operational voltages values shown in Table 3 corresponding to the indicated temperature ranges.

TABLE 3

| 0–20° C. | 3.0 V | 40–50° C. | 3.3 V |
|---|---|---|---|
| 10–20° C. | 3.1 V | 50–60° C. | 3.4 V |
| 20–30° C. | 3.2 V | 60–70° C. | 3.5 V |
| 30–40° C. | 3.2 V | 70–80° C. | 3.6 V |

Using higher predetermined operational voltages at higher temperatures helps to overcome the speed-limiting effect of high temperature on integrated circuit performance.

The predetermined operational voltages may be programmed into the device characteristics map 34 either as part of the manufacturing process (such as where the map 34 comprises ROM memory cells) or during final testing of the integrated circuit device (such as where the map 34 comprises EPROM, EEPROM, or FLASH memory cells). One advantage of programming after final test is that the predetermined operational voltages can be selected to optimize the speed of the particular device. For example, if during final testing a particular device were determined to run slow at low voltage and high temperature the corresponding predetermined operational voltage could be set high to improve performance at that temperature.

In response to the digital temperature value generated by the IC temperature sensor 32, device characteristics map 34 provides the corresponding predetermined operational voltage value to the voltage control signal generator 38. The voltage control signal generator 38 generates the voltage control signals 14 according to the predetermined operational voltage value indicated by map 34.

In a closed-loop design, the voltage control signal generator 38 also receives the supply voltage 16 as a feedback signal, and adjusts, or fine tunes, the voltage control signals according to the actual supply voltage 16 sensed. Thus, a closed-loop design provides an accurate supply voltage 16.

The voltage sensor 36 receives the supply voltage 16 and generates signals that indicate whether the supply voltage 16 is either in or near an inoperable or destructive range. The voltage control signal generator 38 receives the voltage range signals from voltage sensor 36 and the temperature indication from temperature sensor 32 and generates the slow IC 40 and stop IC 42 signals accordingly.

Figure 3:
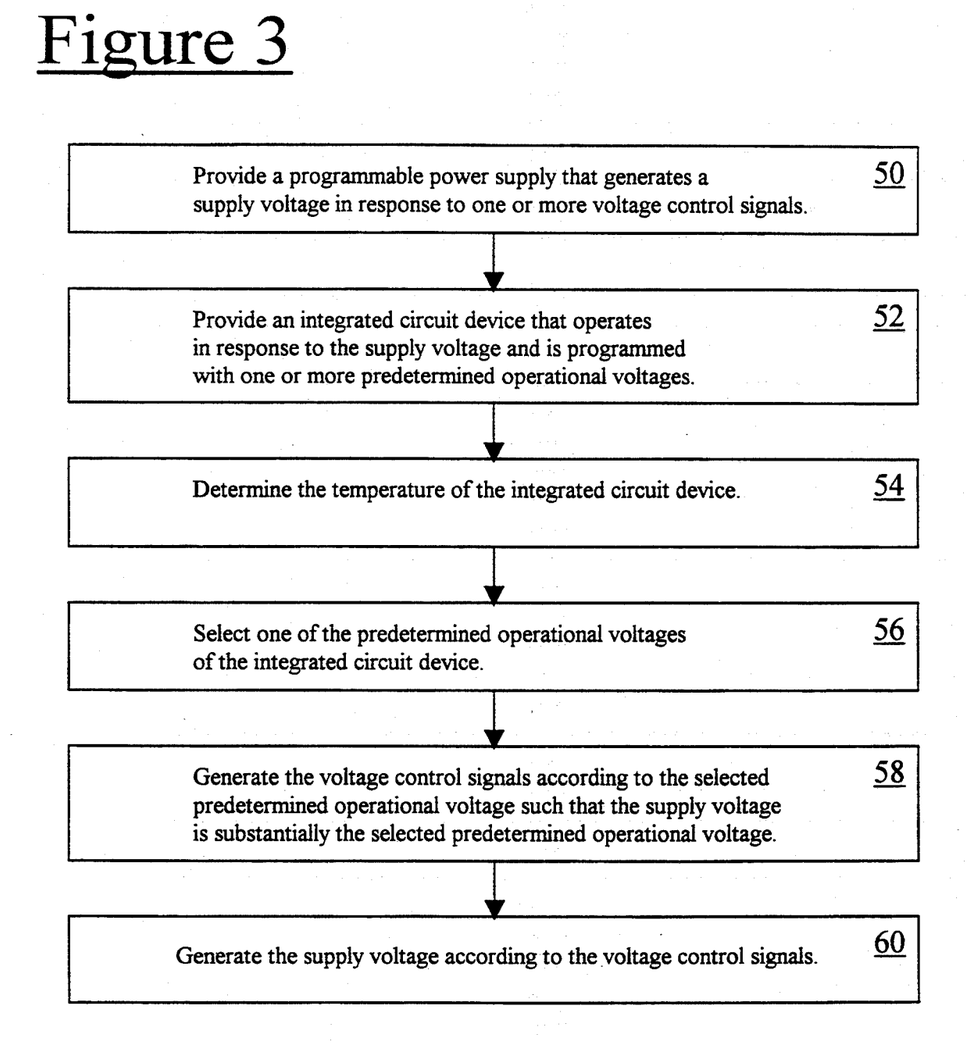
FIG. 3 is a flowchart of a method for controlling a programmable power supply to self-select the operational voltage of an integrated circuit device.

Referring now to FIG. 3, a block diagram of a method for self-selecting the supply voltage of an integrated circuit device is shown. The method begins in step 50 by providing a programmable power supply that generates a supply voltage in response to one or more voltage control signals. Step 52 provides an integrated circuit device that operates in response to the supply voltage. The integrated circuit device is programmed with one or more predetermined operational voltages. For example, a single predetermined operational voltage may indicate that the device requires a specific supply voltage, such as 5.0 or 3.3 volts. A plurality of predetermined operational voltages may represent optimized supply voltages for various temperature ranges of the device.

Step 54 determines the temperature of the integrated circuit device. In one embodiment, an integrated circuit temperature sensor measures the temperature of the device and generates a representative digital value.

Step 56 selects one of the predetermined operational voltages stored in the device. In one embodiment, the selection is based on the temperature of the device such that an optimized operational voltage for the measured device temperature is selected. Alternatively, this selection may be based on other factors including as the particular manufacturing characteristics or the intended application of the device.

In step 58, the integrated circuit device generates the voltage control signals according to the selected predetermined operational voltage such that the supply voltage is substantially equal to the selected predetermined operational voltage. In this manner, the device selects its own supply voltage.

In step 60, the supply voltage is generated by the programmable power supply according to the voltage control signals.

Thus, an integrated circuit device that selects its own supply voltage by controlling a power supply has been described. A method for self-selecting the supply voltage of an integrated circuit device has also been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit device for use with a programmable power supply providing a supply voltage to the integrated circuit device according to at least one voltage control signal, the integrated circuit device comprising:

a temperature sensing circuit providing a temperature signal which corresponds to a current temperature of the integrated circuit device;

a voltage map circuit coupled to the temperature sensing circuit, the voltage mad circuit storing a plurality of values representing operational voltages predetermined for a corresponding plurality of temperature ranges of the integrated circuit device, the voltage mad circuit providing an output value in response to the temperature signal, wherein the output value represents an operational voltage appropriate for the current temperature of the integrated circuit device; and a voltage control circuit coupled to the voltage map circuit, the voltage control circuit generating the at least one voltage control signal in response to the output value such that the supply voltage is substantially equal to the operational voltage.

2. The integrated circuit device of claim 1 wherein the at least one voltage control signal is analog.

3. The integrated circuit device of claim 1 wherein the at least one voltage control signal is digital.

4. The integrated circuit device of claim 1 further comprising:
   internal logic powered from the supply voltage;
   a voltage sensor coupled to the programmable power supply, the voltage sensor generating at least one voltage range signal when the supply voltage is within an excessive supply voltage range; and
   wherein the voltage control circuit is coupled to the voltage sensor and further outputs a slow/stop signal in response to the at least one voltage range signal, the slow/stop signal being coupled to the internal logic to slow or stop operation of the internal logic.

5. An apparatus comprising:
   a programmable power supply providing a supply voltage according to a plurality of voltage control signals;
   an integrated circuit (IC) which includes internal logic powered by the supply voltage, the IC further including a sensor providing a temperature signal which corresponds to a current temperature of the IC; a memory storing a plurality of operational voltage values, the memory outputting an operational voltage value which corresponds to the current temperature in response to the temperature signal; and a control signal generator which generates the plurality of voltage control signals in response to the operational voltage value such that the supply voltage corresponds to the operational voltage value.

6. The apparatus of claim 5 wherein the IC further comprises:
   a voltage sensor coupled to the programmable power supply, the voltage sensor generating a voltage range signal when the supply voltage is within an excessive supply voltage range; and
   wherein the Control signal generator is coupled to the voltage sensor and further provides a slow/stop signal in response to the voltage range signal, the slow/stop signal being coupled to the internal logic to slow or stop the operation of the internal logic.

7. The apparatus of claim 6 wherein the memory comprises a non-volatile memory device.

* * * * *

UNITED STATES PATENT AND TRADEMARK OFFICE
CERTIFICATE OF CORRECTION

PATENT NO. : 5,440,520
DATED : August 8, 1995
INVENTOR(S) : Schutz et al.

It is certified that error appears in the above-identified patent and that said Letters Patent is hereby corrected as shown below:

In column 8 at line 53 delete "mad" and insert --map--

In column 8 at line 57 delete "mad" and insert --map--

In column 10 at line 15 delete "Control" and insert --control--

In column 10 at line 15 delete "to-" and insert --to--

Signed and Sealed this

Fifth Day of November, 1996

Attest:

BRUCE LEHMAN

*Attesting Officer*          *Commissioner of Patents and Trademarks*